(12) United States Patent
Gosch et al.

(10) Patent No.: US 11,558,973 B2
(45) Date of Patent: Jan. 17, 2023

(54) HARSH ENVIRONMENT KEY PANEL AND BEZEL STRUCTURES

(71) Applicant: Rockwell Collins, Inc., Cedar Rapids, IA (US)

(72) Inventors: Clint L. Gosch, Cedar Rapids, IA (US); Matthew W. Ahrens, Marion, IA (US); Brandon J. Cormier, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/124,287

(22) Filed: Dec. 16, 2020

(65) Prior Publication Data
US 2021/0105906 A1  Apr. 8, 2021

Related U.S. Application Data (62) Division of application No. 16/719,287, filed on Dec. 18, 2019, now Pat. No. 10,905,023, which is a
(Continued)

(51) Int. Cl.
*H01H 13/83* (2006.01)
*H05K 5/06* (2006.01)
(Continued)

(52) U.S. Cl.
CPC ............ *H05K 5/061* (2013.01); *G06F 1/182* (2013.01); *H01H 13/06* (2013.01); *H01H 13/83* (2013.01)

(58) Field of Classification Search
CPC ............ H01H 13/83; H01H 2219/062; H01H 13/023; H01H 2219/06; H01H 2219/056; H01H 2219/064; H01H 2219/044; H01H 2219/014; H01H 2219/036; H01H 2221/044; H01H 9/182; H01H 13/06; H01H 2223/002; H01H 9/04; H01H 13/86; H01H 2009/048; H01H 13/063; H01H 21/08; H01H 23/06; H01H 13/14; H01H 13/7065; H01H 13/20; H01H 3/12; B33Y 40/00;
(Continued)

(56) References Cited

U.S. PATENT DOCUMENTS

5,401,927 A * 3/1995 Lundell ............... H01H 13/702
200/310
5,734,136 A  3/1998 Newcomer et al.
(Continued)

*Primary Examiner* — Ahmed M Saeed
(74) *Attorney, Agent, or Firm* — Suiter Swantz pc llo (57) ABSTRACT

Harsh environment key panel and bezel structures for a user interface device are disclosed. In embodiments, a user interface device includes a printed board, a switch mounted to the printed board, and a key panel disposed upon the printed board. The key panel includes a plurality of printed device layers forming a bezel, a button configured to actuate the switch, and a deformable interface between the bezel and the button. The plurality of printed device layers can include at least one continuous printed device layer that forms portions of the bezel, the button, and the deformable interface. The continuous printed device layer may include at least one rigid device material that forms a portion of the bezel and a portion of the button and a deformable device material that forms a portion of the deformable interface between the bezel and the button.

9 Claims, 11 Drawing Sheets

Related U.S. Application Data division of application No. 15/948,469, filed on Apr. 9, 2018, now Pat. No. 10,548,235.

(51) Int. Cl.
*H01H 13/06* (2006.01)
*G06F 1/18* (2006.01)

(58) Field of Classification Search
CPC ......... B33Y 10/00; B33Y 30/00; B33Y 50/02; B33Y 40/20; B33Y 70/00; B33Y 80/00; B33Y 40/10; B33Y 50/00; B33Y 70/10; B33Y 99/00
See application file for complete search history.

(56) References Cited

U.S. PATENT DOCUMENTS

| | | |
|---|---|---|
| 2015/0221460 A1 | 8/2015 | Teplitxky et al. |
| 2016/0225551 A1 | 8/2016 | Shedletsky |
| 2017/0069444 A1 | 3/2017 | Wang et al. |
| 2018/0001076 A1 | 1/2018 | Fenton et al. |
| 2018/0218856 A1* | 8/2018 | Ito ........................ H01H 13/023 |
| 2018/0263133 A1* | 9/2018 | Lu ......................... G06F 1/1656 |
| 2019/0108951 A1 | 4/2019 | Tsuchiya |

* cited by examiner

HARSH ENVIRONMENT KEY PANEL AND BEZEL STRUCTURES

CROSS-REFERENCE TO RELATED APPLICATIONS

The present application is a divisional of U.S. patent application Ser. No. 16/719,287, "HARSH ENVIRONMENT KEY PANEL AND BEZEL STRUCTURES," filed Dec. 18, 2019, which is a divisional of U.S. patent application Ser. No. 15/948,469, "HARSH ENVIRONMENT KEY PANEL AND BEZEL STRUCTURES," filed Apr. 9, 2018, which are each incorporated herein by reference in the entirety.

BACKGROUND

User interface devices often include key panels that can be used to make selections, input data, and so forth. In harsh environments, key panels may be subject to water and/or debris (e.g., dust, sand, etc.) that can cause damage to underlying circuitry or components if the water and/or debris enters an airgap that typically exists between the bezel and buttons (sometimes referred to as "keys") of the key panel.

To keep out moisture and debris, a harsh environment key panel may include a flexible rubber substrate placed over the buttons, or placed over switches on a printed board below the buttons. Either approach requires multiple parts to be manufactured and assembled. Tolerances must be tightly controlled to ensure product integrity and survivability. Furthermore, some of the tactile feedback from the switches can be lost through the cushioning effect of the rubber substrate, resulting in a lower quality user experience.

Another approach for keeping out moisture and debris, is to use membrane type switches (instead of mechanical switches) for the key panel. Membrane type switches are typically low profile, lightweight, and cheap to manufacture in large quantities. However, membrane type switches generally do not have good tactile feedback when actuated. Durability of the switch membranes can also become a concern in high usage cases.

An avionic key panel typically includes a small amount of gasket material around each button to keep dust and other debris out of the key panel assembly. However, this gasket material does little to keep out moisture, especially if a button is pressed during exposure or if the key panel itself has continuous exposure to water or other moisture. There have been some cases of avionic key panels failing due to extreme exposure to sand or dust. For example, the switches located below the buttons can become jammed by debris and stop actuating as a result.

Several approaches for making harsh environment key panel and bezel structures exist. However, as demonstrated above, the existing harsh environment key panels have various structural limitations or process difficulties associated with their manufacture. Consequently, there is a need for robust and low cost key panel and bezel structures that work well to keep moisture and debris from reaching printed boards, switches, and other underlying key panel circuitry and/or components.

SUMMARY

In one aspect, embodiments of the inventive concepts disclosed herein are directed to harsh environment key panel and bezel structures for a user interface device. In embodiments, a user interface device includes a printed board (e.g., a printed wiring board (PWB), printed circuit board (PCB), or the like), a switch mounted to the printed board, and a key panel disposed upon the printed board. The key panel includes a plurality of printed device layers (e.g., three-dimensional (3D) printed device layers) forming a bezel, a button configured to actuate the switch, and a deformable interface between the bezel and the button. Forming the entire key panel out of one continuous print makes it much harder for debris or moisture to penetrate the structure. For example, the plurality of printed device layers includes at least one continuous printed device layer that forms portions of the bezel, the button, and the deformable interface. The continuous printed device layer includes at least one rigid device material that forms a portion of the bezel and a portion of the button, and the continuous printed device layer further includes a deformable device material that forms a portion of the deformable interface between the bezel and the button. The deformable interface between the bezel and the button prevents debris and moisture from reaching the underlying switch and printed board while still allowing the button to move relative to the bezel.

In a further aspect, embodiments of the inventive concepts disclosed herein are directed to manufacturing a key panel. The method can include printing a plurality of device layers with a three-dimensional printer to form a bezel, a button configured to actuate a switch, and a deformable interface between the bezel and the button. Printing the plurality of device layers can include forming at least one discontinuous printed device layer that includes portions of the bezel, the button, and an airgap between the bezel and the button by dispensing at least one rigid-when-cured device material to form the portions of the bezel and the button, dispensing a support material to form a temporary structure that provides support for other device layers disposed upon the discontinuous printed device layer, and removing the support material with a solvent to form the airgap after printing the other device layers on the discontinuous printed device layer. Printing the plurality of device layers can also include forming a continuous printed device layer that includes portions of the bezel, the button, and the deformable interface by dispensing at least one rigid-when-cured device material to form a portion of the bezel and a portion of the button and dispensing a deformable-when-cured device material to form a portion of the deformable interface between the bezel and the button. A plurality of discontinuous and continuous printed device layers can be printed on top of one another to form a key panel out of one continuous print. For example, after removing the support material to finalize the discontinuous layers, the resulting structure may be a key panel, such as the key panel of the user interface device described above.

In a further aspect, embodiments of the inventive concepts disclosed herein are directed to a user interface device that includes 3D printed hand stabilizer. In embodiments, the user interface device a touchscreen display, a bezel surrounding at least a portion of the touchscreen display, a gasket disposed between the touchscreen display and the bezel, and a plurality of printed device layers that form a hand stabilizer disposed upon the bezel. The plurality of printed device layers can include at least one continuous printed device layer that includes a first rigid device material that forms an outer portion of the hand stabilizer and a second rigid device material that forms a portion of a light guide embedded within the hand stabilizer. The user interface device further includes a printed board with a light source mounted to the printed board, where the light source is configured to direct illumination through the light guide embedded within the hand stabilizer. In embodiments, the illumination can make the hand stabilizer easier to find and/or light up symbols or icons on the hand stabilizer. In some embodiments, the bezel and the hand stabilizer are both printed together as one continuous print. In other embodiments, the hand stabilizer is printed and then mounted to the bezel.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of or sub-combination of two or more such features, along with any other features which may not necessarily be expressly described or inherently present in the instant disclosure.

Broadly, embodiments of the inventive concepts disclosed herein are directed to harsh environment key panel and bezel structures and techniques for manufacturing the same. The traditional approaches for making harsh environment key panel and bezel structures have worked well for various applications, but improvements in additive manufacturing (e.g., 3D printing) technology have opened up new possibilities for creating more robust user interface devices. In embodiments of this disclosure, a key panel is formed as a continuous 3D printed structure so that moisture and debris (e.g., sand, dust, chemical debris, caustic gas, etc.) cannot penetrate the key panel to cause errant behavior or damage to the key panel switches and other underlying components or circuitry. 3D printing technology can produce assemblies using multiple materials and/or multiple durometers in the same print. The material properties can range from a hard plastic to a soft rubber while printing in a high enough resolution to produce a usable surface finish. Furthermore, different colors and material transparencies can be selected. Consequently, forming key panels with 3D printing technology allows for harsh environment key panels and user interface devices to be made in an affordable manner with less process constraints than traditional techniques for making harsh environment key panels. This is because the buttons, the bezel, and the deformable interface materials that keep out moisture and debris can all be printed together rather than having to be individually manufactured and then assembled.

Figure 1:
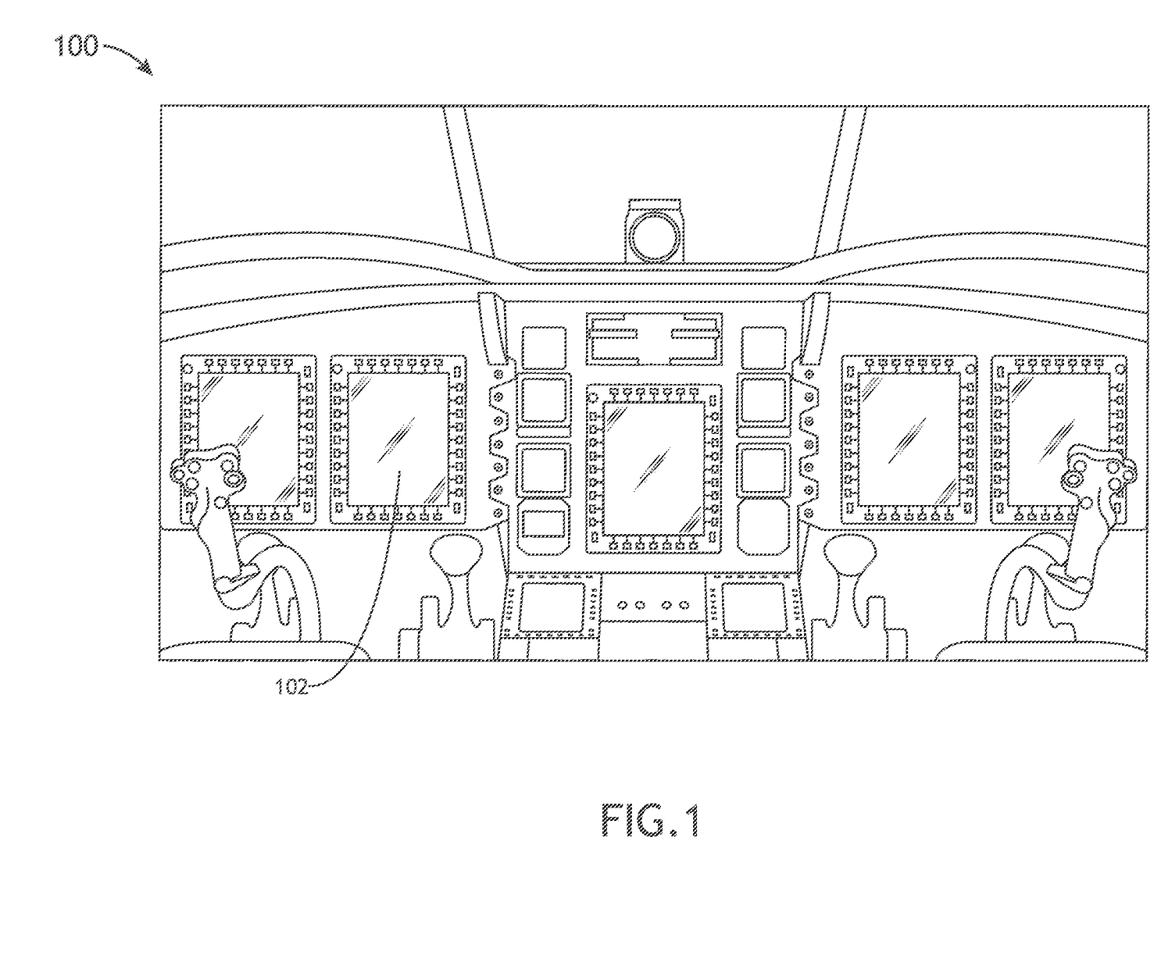
FIG. 1 is an illustration of an aircraft environment in which a user interface device with a harsh environment key panel can be implemented, in accordance with example embodiments of this disclosure.
Figure 2:
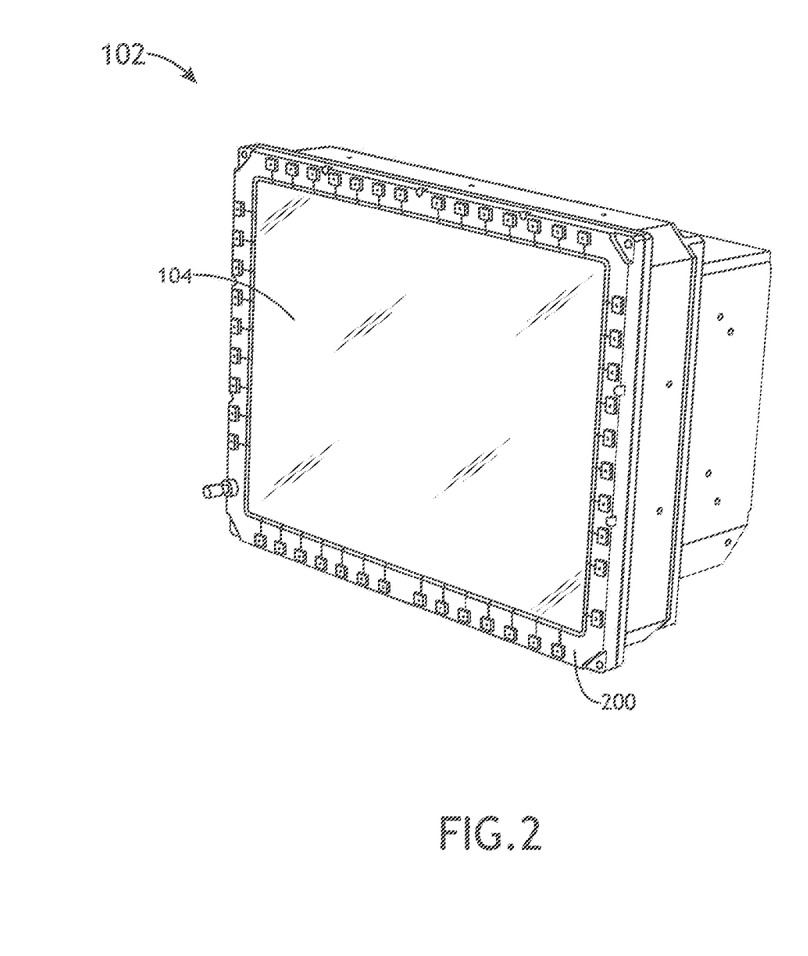
FIG. 2 is a perspective view of a user interface device with a harsh environment key panel integrated within a bezel for a display, in accordance with example embodiments of this disclosure.

FIG. 1 illustrates an example embodiment of an aircraft environment 100 (e.g., a cockpit) that includes one or more user interface devices 102 (e.g., multi-function displays for navigation, control, communication, flight information, aircraft information, diagnostics, etc.) with harsh environment key panel and/or bezel structures. In an example embodiment shown in FIG. 2, the user interface device 102 includes a display 104 and a harsh environment key panel 200 integrated within a bezel for the display 104. Harsh environment key panels 200 can be integrated within a variety of other user interface devices 102. For example, in other embodiments, the harsh environment key panel 200 may be integrated within a keypad or key board that is proximate to a display or configured as a separate (e.g., stand-alone) component.

Figure 3:
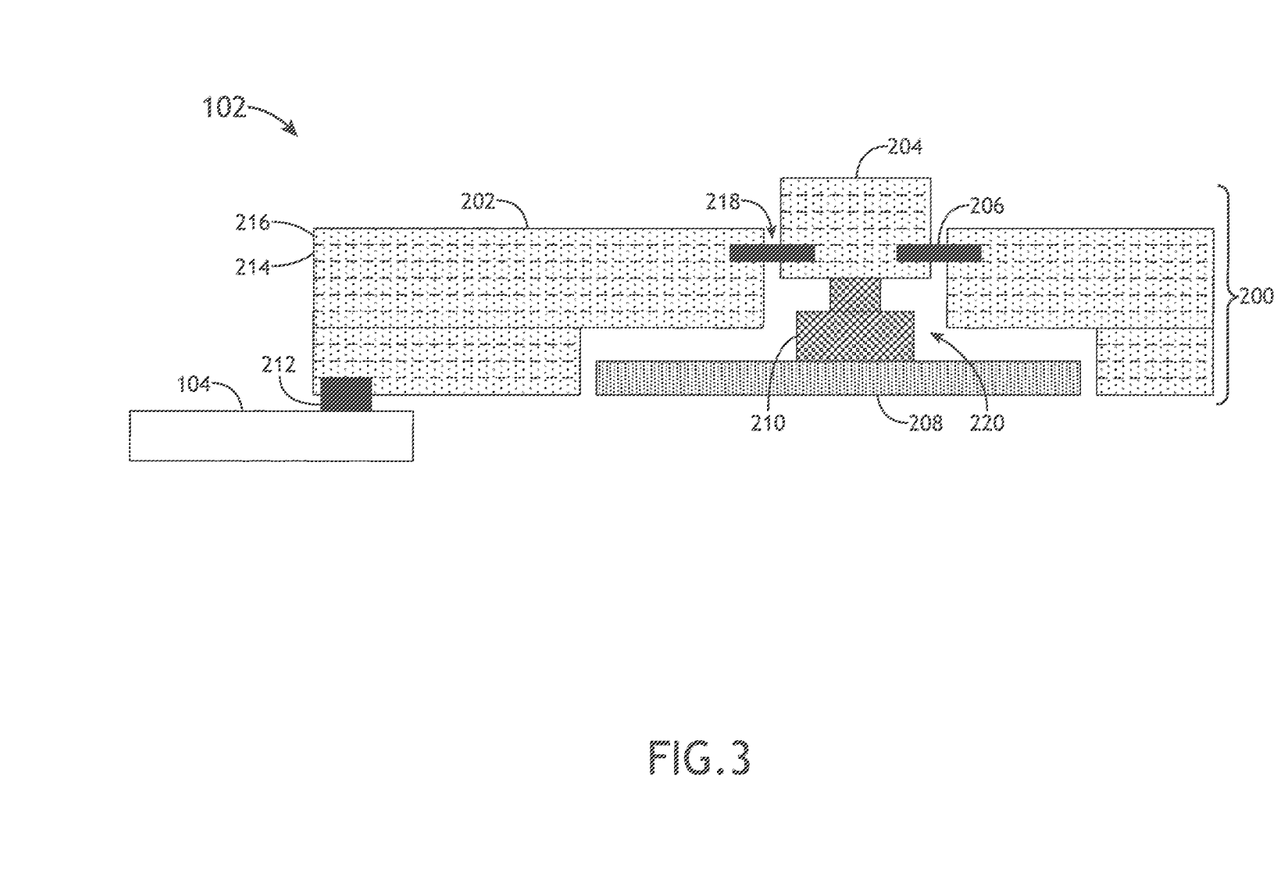
FIG. 3 is a cross-sectional side view of a harsh environment key panel and bezel structure of a user interface device, in accordance with example embodiments of this disclosure.
Figure 4:
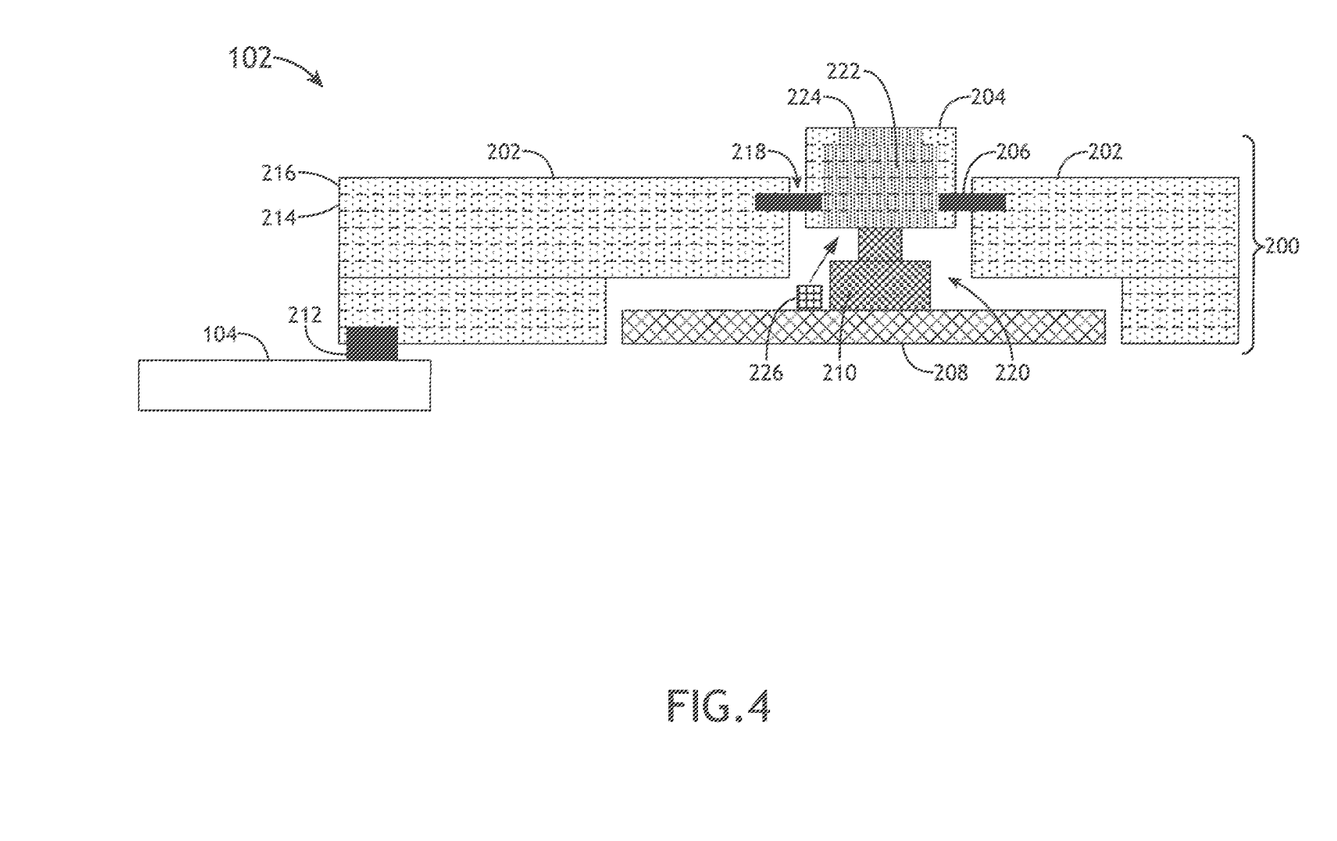
FIG. 4 is a cross-sectional side view of a harsh environment key panel and bezel structure of a user interface device, in accordance with example embodiments of this disclosure.
Figure 5:
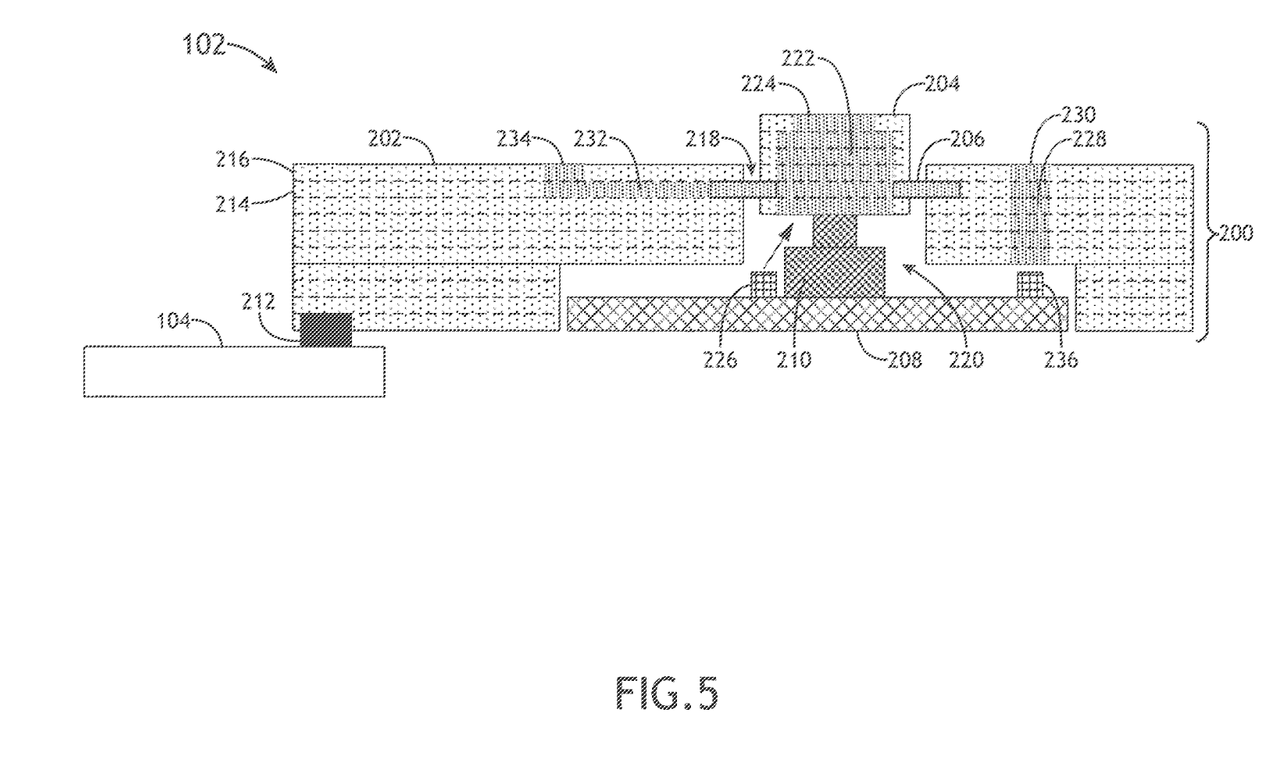
FIG. 5 is a cross-sectional side view of a harsh environment key panel and bezel structure of a user interface device, in accordance with example embodiments of this disclosure.

Example embodiments of a harsh environment key panel 200 are illustrated in FIGS. 3 through 5. As shown in FIG. 3, a printed board 208 (e.g., a printed wiring board (PWB) or printed circuit board (PCB)) can be disposed below the key panel 200. The printed board 208 can have at least one switch 210 (e.g., a depressible switch) mounted to the printed board 208. For example, the switch 210 may be soldered to the printed board 208 and/or mated with one or more connectors (e.g., pins or sockets) on the printed board 208. The key panel 200 may be mounted or otherwise secured to the printed board 208. In embodiments, the key panel 200 includes a switch cavity 220 that is configured to have at least a portion of the printed board 208 disposed within the cavity 220. In some embodiments, the key panel 200 is mounted (e.g., adhered or fastened) to the printed board 208 so that moisture and debris cannot enter the cavity 220. For example, the key panel 200 and the printed board 208 may have a gasket material or other seal disposed between them to prevent moisture and debris from entering the cavity 220. In other embodiments the printed board 208 forms a portion of the key panel 200. For example, the printed board 208 can be formed from one or more printed device layers that make up portions of the key panel 200.

The key panel 200 includes a plurality of printed device layers (e.g., 3D printed device layers) that form a bezel 202, at least one button 204, and a deformable interface 206 between the bezel 202 and the button 204. The button 204, when pressed, is configured to actuate (e.g., depress) the switch 210. Typically, push-button events are when a key panel is most vulnerable to moisture or debris entering the switch cavity. For example, in some key panels, a push-button event may displace the gasket material around a button and temporarily break the seal between the button and the bezel as a result. The deformable interface 206 is configured to prevent moisture or debris from entering the switch cavity 220 of the key panel 200. The deformable interface 206 is formed from at least one continuous printed device layer 214 that also forms portions of the bezel 202 and the button 204. Thus, the continuous printed device layer 214, as a whole, prevents moisture or debris from entering the cavity 220. For example, the deformable interface 206 (i.e., a portion of the continuous printed device layer 214) flexes or otherwise deforms so that the button 204 can be pressed to trigger the switch 210, but the seal between the bezel 202 and the button 204 is never broken.

In embodiments, the continuous printed device layer 214 includes at least one rigid device material that forms a portion of the bezel 202 and a portion of the button 204, and the continuous printed device layer 214 further includes a deformable device material that forms at least a portion of the deformable interface 206 between the bezel 202 and the button 204. The key panel 200 may include a plurality of continuous device layers. The printed device layers of the key panel 200 further include a plurality of discontinuous device layers. For example, the key panel 200 includes at least one discontinuous printed device layer 216 that forms portions of the bezel 202, the button 204, and an airgap 218 between the bezel 202 and the button 204. The plurality of discontinuous printed device layers also forms portions of the bezel 202 that define the switch cavity 220 and portions of the button 204 that protrude from the bezel 202.

The switch cavity 220 is configured to receive the switch 210 so that the switch 210 is at least partially disposed within the switch cavity 220 and is adjacent to (e.g., positioned right below and/or against) the button 204. For example, the printed board 208 can be fully or partially disposed within the switch cavity 220 or disposed adjacent to the switch cavity 220. In embodiments, the printed board 208 may be adhered or otherwise mounted to the bezel 202 so that the printed board 208 is at least partially disposed within the within the switch cavity 220 or secured to the bezel 202 at a fixed position that is adjacent to the switch cavity 220.

The discontinuous printed device layers 216 may include the same rigid material or materials as the continuous printed device layers 214 that form portions of the bezel 202 and/or button 204. In embodiments, the portions of the switch cavity 220 and/or air gap 218 that are defined by a discontinuous printed device layer 216 may be formed by printing a support material in a temporarily continuous layer with the rigid and/or deformable device materials. The support material can then be removed after the rigid and deformable materials are cured (e.g., dried and/or hardened) to produce the discontinuous printed device layer 216 including portions of the bezel 202 and/or button 204 and defining portions of the switch cavity 220 and/or air gap 218.

In some embodiments, the bezel 202 and button 204 portions of one or more printed device layers (e.g., continuous printed device layers 214 or discontinuous printed device layers 216) include a plurality of rigid device materials. For example, the bezel 202 portions may include a first rigid device material and the button 204 portions may include a second rigid device material. In other embodiments, the bezel 202 and the button 204 are formed from the same rigid device material. In some embodiments, the bezel 202 portion can include multiple rigid device materials, and/or the button 204 portions can include multiple rigid device materials.

FIG. 4 illustrates an example embodiment with the printed device layers that form the button 204 including a first rigid device material (e.g., an opaque device material) that forms an outer portion of the button 204 and a second rigid device material (e.g., a transparent or translucent device material) that forms a light guide 222 embedded within the button 204. The light guide 222 may be configured to receive illumination from a light source 226 (e.g., a light-emitting diode (LED)) that is mounted to the printed board 208. For example, the light source 226 may be configured to direct illumination into the light guide 222 in order to illuminate at least a portion of the button 204 and/or indicia 224 (e.g., a pattern, symbol, character, etc.) on a top surface of the button 204.

In another example embodiment (FIG. 5), the printed device layers that form the bezel 202 may include a first rigid device material (e.g., an opaque device material) that forms an outer portion of the bezel 202 and a second rigid device material (e.g., a transparent or translucent device material) that forms a light guide 228 embedded within the bezel 202. The light guide 228 may be configured to receive illumination from a light source 236 (e.g., a LED) that is mounted to the printed board 208. For example, the light source 236 may be configured to direct illumination into the light guide 228 in order to illuminate at least a portion of the bezel 202 and/or indicia 230 (e.g., a pattern, symbol, character, etc.) on a top surface of the bezel 202.

In some embodiments, the second rigid device material (e.g., a transparent or translucent device material) forms a light guide 222 embedded within the button 204 and a light guide 232 embedded within the bezel 202. The deformable material that forms the deformable interface 206 may also be a transparent or translucent device material. For example, the deformable interface 206 may be configured to light up the air gap 218 between the bezel 202 and the button 204. The deformable interface 206 can also be configured to optically couple the light guide 222 embedded within the button 204 and the light guide 232 embedded within the bezel 202. In some embodiments, a shared light source (e.g., light source 226) can be configured to direct illumination into any of light guide 222, light guide 232, or the deformable interface 206 to illuminate both of the light guides 222 and 232 and the deformable interface 206 and/or indicia (e.g., indicia 224 and/or 234) on a top surface of the button 204 and/or bezel 202.

In embodiments, the key panel 200 is adjacent to a display 104. For example, the user interface device 102 can include a display 104 that is at least partially surrounded by the bezel 202. The bezel 202 may be mounted (e.g., adhered or otherwise coupled) to the display 104, or to a device that supports the display 104, with a gasket 212 disposed between the display 104 and the bezel 202. In some embodiments, the gasket 212 is formed by the plurality of printed device layers. For example, at least one of the printed device layers that form that key panel 200 can include rigid device material that forms a portion of the bezel 202 and deformable device material that forms a portion of the gasket 212. In other embodiments, the gasket 212 is separate from the bezel 202 and may be adhered or otherwise coupled to the bezel 202.

Figure 6:
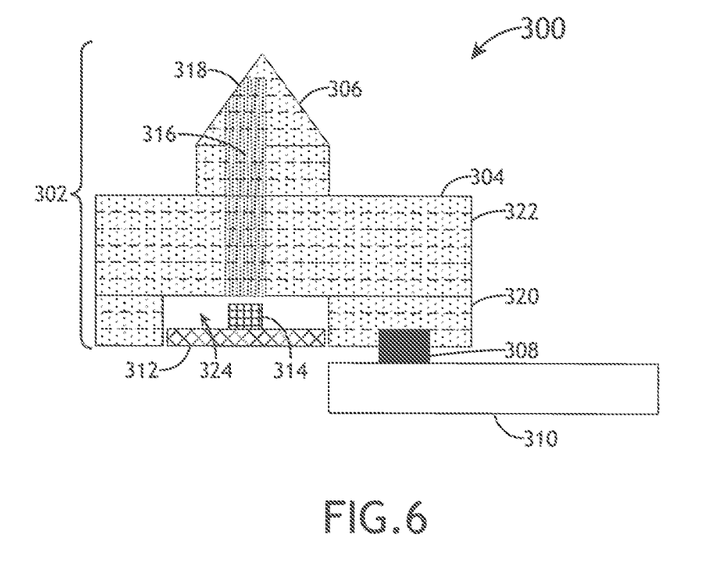
FIG. 6 is a cross-sectional side view of a bezel structure of a user interface device with a hand stabilizer integrated within the bezel structure, in accordance with example embodiments of this disclosure.

FIG. 6 illustrates an example embodiment of another user interface device 300 (e.g., a touchscreen multi-function display) that includes a bezel 304 with a hand stabilizer 306 (e.g., an anchor or grip) that projects from the bezel 304 so that a user can use the hand stabilizer 306 for support while interfacing a touchscreen display 310. The user interface device 300 includes a plurality of printed device layers 302 that form the bezel 304 and the hand stabilizer 306 disposed upon the bezel 304. In embodiments, the touchscreen display 310 is at least partially surrounded by the bezel 304. The bezel 304 may be mounted (e.g., adhered or otherwise coupled) to the touchscreen display 310, or to a device that supports the touchscreen display 310, with a gasket 308 disposed between the touchscreen display 310 and the bezel 304. In some embodiments, the gasket 308 is formed by the plurality of printed device layers 302. For example, at least one of the printed device layers 302 can include rigid device material that forms a portion of the bezel 304 and deformable device material that forms a portion of the gasket 308. In other embodiments, the gasket 308 is separate from the bezel 304 and may be adhered or otherwise coupled to the bezel 304.

The plurality of printed device layers 302 include a plurality of printed device materials. For example, the printed device layers 302 include one or more continuous printed device layers 322 that include a first rigid device material (e.g., an opaque device material) that forms outer portions of the bezel 304 and the hand stabilizer 306 and a second rigid device material (e.g., a transparent or translucent device material) that forms a portion of a light guide 316 embedded within the bezel 304 and the hand stabilizer 306. The light guide 316 may be configured to receive illumination from a light source 314 (e.g., a light-emitting diode (LED)) that is mounted to a printed board 312. For example, the light source 314 may be configured to direct illumination into the light guide 316 in order to illuminate at least a portion of the hand stabilizer 306 and/or indicia 318 (e.g., a pattern, symbol, character, etc.) on a planar surface of the hand stabilizer 306.

The printed device layers 302 further include a plurality of discontinuous devices layers. For example, the printed device layers 302 include at least one discontinuous printed device layer 320 that forms portions of the bezel 304 and defines portions of a cavity 324 for the light source 314. In some embodiments, the bezel 304 is mounted (e.g., adhered or fastened) to the printed board 312 so that moisture and debris cannot enter the cavity 324. For example, the bezel 304 and the printed board 312 may have a gasket material or other seal disposed between them to prevent moisture and debris from entering the cavity 324. In other embodiments the printed board 312 forms a portion of the bezel 304 structure. For example, the printed board 312 can be formed from one or more printed device layers that make up portions of the bezel 304.

Figure 7:
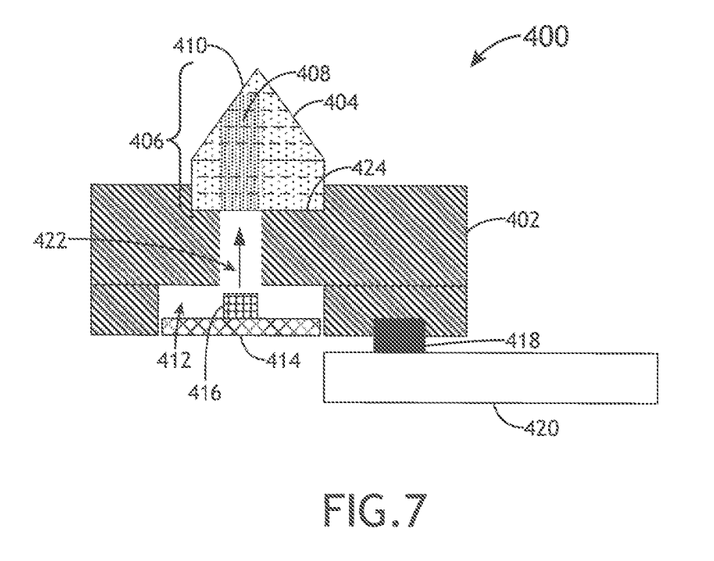
FIG. 7 is a cross-sectional side view of a bezel structure of a user interface device with a hand stabilizer mounted to the bezel structure, in accordance with example embodiments of this disclosure.

FIG. 7 illustrates an example embodiment of another user interface device 400 (e.g., a touchscreen multi-function display) that includes a metal (e.g., aluminum) bezel 402 with a hand stabilizer 404 (e.g., an anchor or grip) that projects from the bezel 402 so that a user can use the hand stabilizer 404 for support while interfacing a touchscreen display 420. The user interface device 400 includes a plurality of printed device layers 406 that form the hand stabilizer 404 disposed upon the bezel 402. For example, the hand stabilizer 404 can be formed from the plurality of printed device layers 406 and then mounted (e.g., adhered or otherwise coupled) to the bezel 402. The bezel 402 may include a recess 424 configured to receive at least a portion of the hand stabilizer 404 so that the hand stabilizer 404 is partially embedded within the bezel 402.

In embodiments, the touchscreen display 420 is at least partially surrounded by the bezel 402. The bezel 402 may be mounted (e.g., adhered or otherwise coupled) to the touchscreen display 420, or to a device that supports the touchscreen display 420, with a gasket 418 disposed between the touchscreen display 420 and the bezel 402. The gasket 418 may be adhered or otherwise coupled to the bezel 402. The bezel 402 can also include a cavity 412 for a light source 416 (e.g., a LED) that can be at least partially disposed within the cavity 412. The bezel 402 may further include a light path 422 (e.g., an airway or light guide) defined or embedded within the bezel 402 so that the light source 416 can direct light along the light path 422 towards the hand stabilizer 404. The light source 416 may be mounted to a printed board 414 that is coupled to the bezel 402. For example, the bezel 402 can be mounted (e.g., adhered or fastened) to the printed board 414 so that moisture and debris cannot enter the cavity 412. In embodiments, the bezel 402 and the printed board 414 may have a gasket material or other seal disposed between them to prevent moisture and debris from entering the cavity 412.

The plurality of printed device layers 406 include a plurality of printed device materials. For example, the printed device layers 406 include a plurality of continuous printed device layers that include a first rigid device material (e.g., an opaque device material) that forms outer portions of the hand stabilizer 404 and a second rigid device material (e.g., a transparent or translucent device material) that forms a portion of a light guide 408 embedded within the hand stabilizer 404. The light guide 408 may be configured to receive illumination from the light source 416. For example, the light source 416 may be configured to direct illumination into the light guide 408 in order to illuminate at least a portion of the hand stabilizer 404 and/or indicia 410 (e.g., a pattern, symbol, character, etc.) on a planar surface of the hand stabilizer 404.

Figure 8:
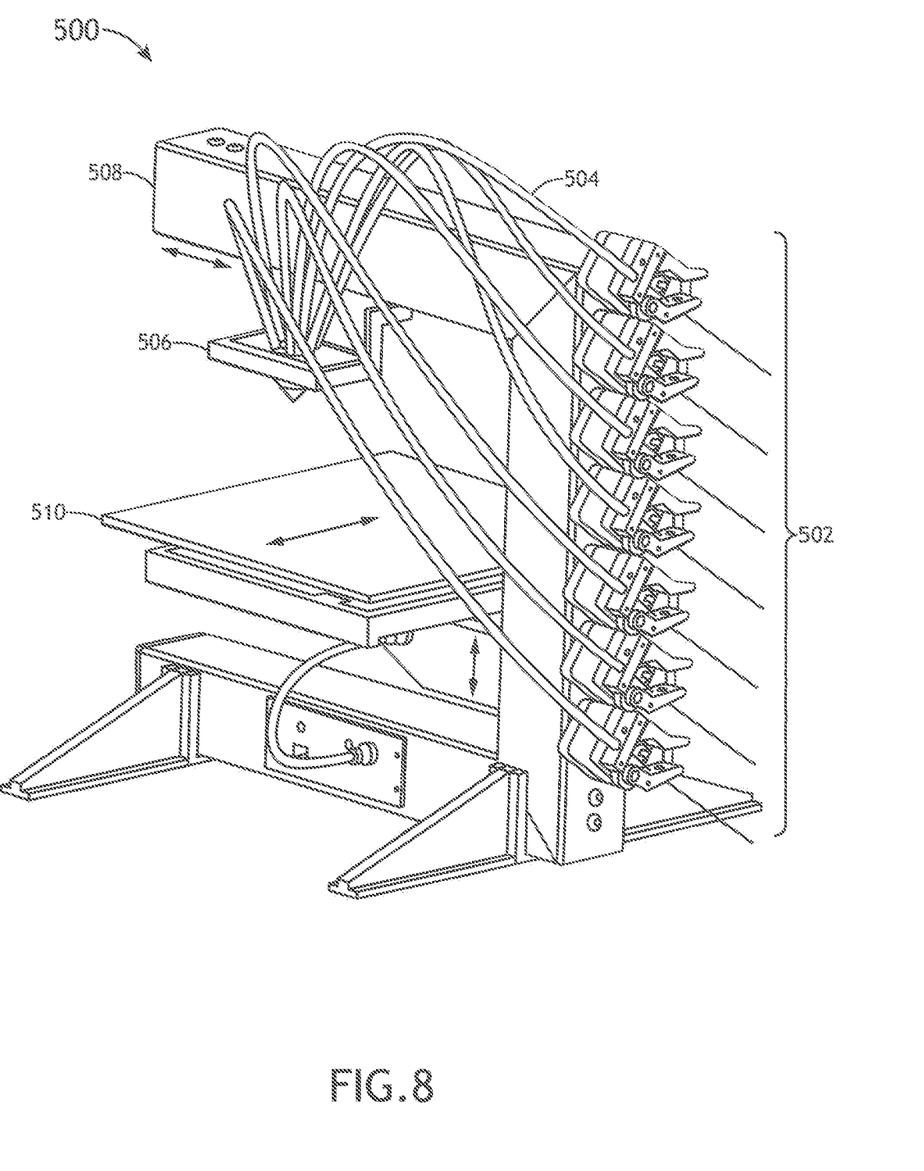
FIG. 8 is a perspective view of a three-dimensional printer for printing a harsh environment key panel and bezel structure, in accordance with example embodiments of this disclosure.

FIG. 8 illustrates an example embodiment of a 3D printer 500 that can be employed in the manufacture of key panel and bezel structures described herein. The 3D printer may include a plurality of feeders 502 configured to feed two or more strands 504 of device material (e.g., different types and/or colors of device material) to a print nozzle 506 (or an assembly of print nozzles). The 3D printer 500 may further include a stage 510 configured to support printed device layers and an arm 508 configured to hold the print nozzle 506 above the stage 510. The stage 510 and/or the arm 508 can be configured to actuate (e.g., up, down, forwards, backwards, and/or sideways) so that the printed device layers can be disposed upon one another to form a 3D printed structure (e.g., key panel and/or bezel structure). The 3D printer 500 illustrated in FIG. 8 is provided as an example, and it is to be understood that other types of 3D printers can be employed. Any 3D printer that is configured to print structures with a plurality of device materials (e.g., in continuous device layers) can be used to manufacture the key panel and bezel structures described herein.

Figure 9:
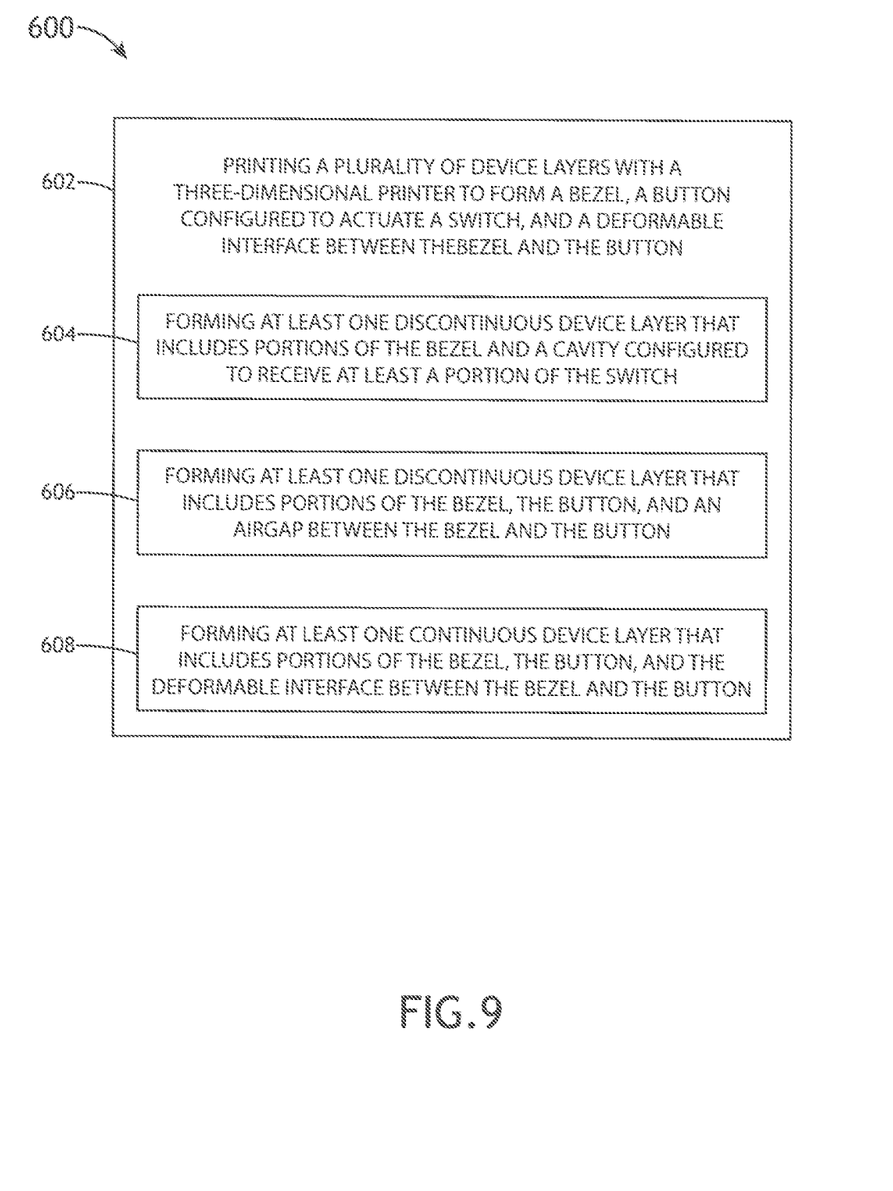
FIG. 9 is a flow diagram illustrating an example implementation of a method for manufacturing a harsh environment key panel and bezel structure.

FIG. 9 illustrates an example implementation of a method 600 of manufacturing a key panel, such as the key panel 200 illustrated according to various example embodiments in FIGS. 2 through 5. FIGS. 10A through 10H illustrate various stages of the method 600, in accordance with an example implementation, whereby a key panel 700 is manufactured with a 3D printer, such as the 3D printer 500 illustrated in FIG. 8, or the like. In general, operations of disclosed processes (e.g., method 600) may be performed in an arbitrary order, unless otherwise provided in the claims.

Figure 10A:
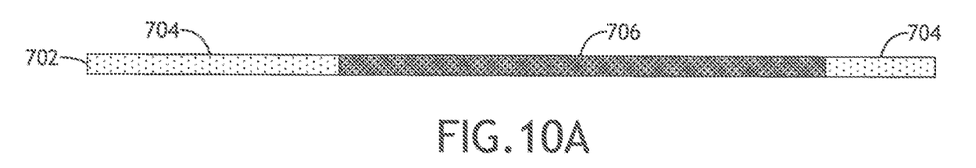
FIG. 10A is a cross-sectional side view of a printed device layer during a process of manufacturing a harsh environment key panel and bezel structure, in accordance with example embodiments of this disclosure.
Figure 10B:
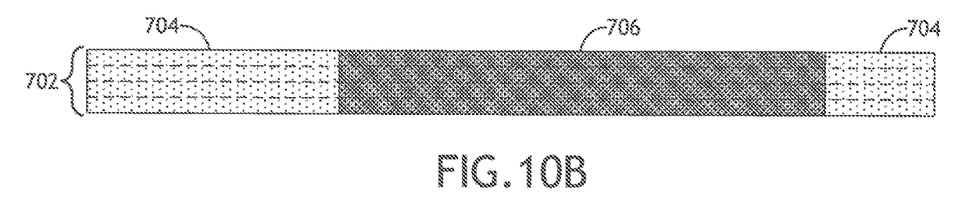
FIG. 10B is a cross-sectional side view of a plurality of printed device layers during a process of manufacturing a harsh environment key panel and bezel structure, in accordance with example embodiments of this disclosure.
Figure 10C:
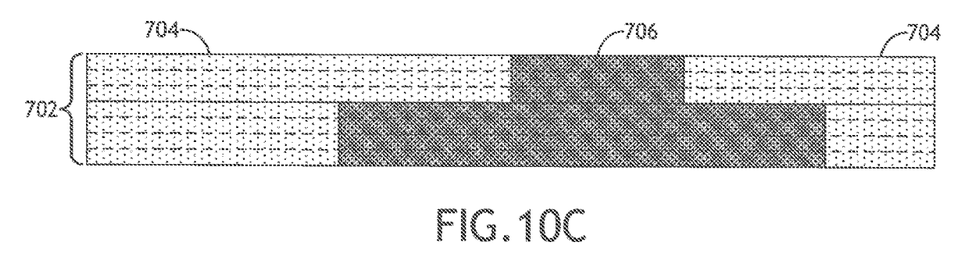
FIG. 10C is a cross-sectional side view of a plurality of printed device layers during a process of manufacturing a harsh environment key panel and bezel structure, in accordance with example embodiments of this disclosure.
Figure 10D:
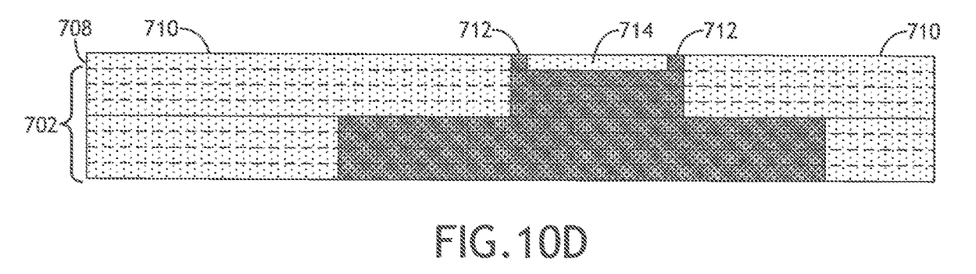
FIG. 10D is a cross-sectional side view of a plurality of printed device layers during a process of manufacturing a harsh environment key panel and bezel structure, in accordance with example embodiments of this disclosure.
Figure 10E:
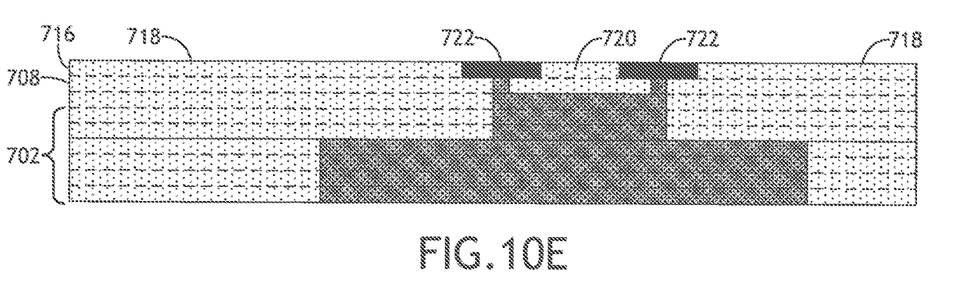
FIG. 10E is a cross-sectional side view of a plurality of printed device layers during a process of manufacturing a harsh environment key panel and bezel structure, in accordance with example embodiments of this disclosure.
Figure 10F:
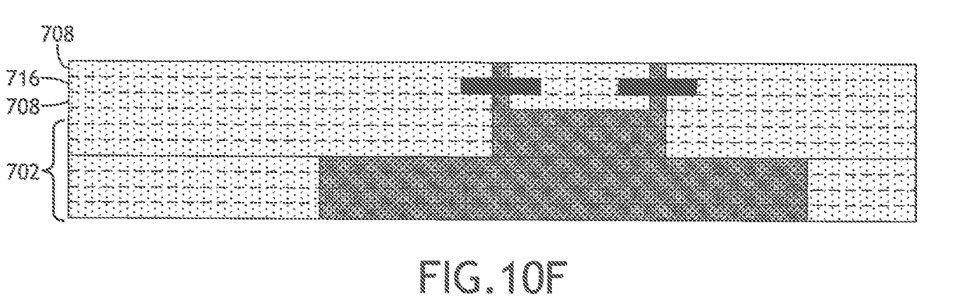
FIG. 10F is a cross-sectional side view of a plurality of printed device layers during a process of manufacturing a harsh environment key panel and bezel structure, in accordance with example embodiments of this disclosure.
Figure 10G:
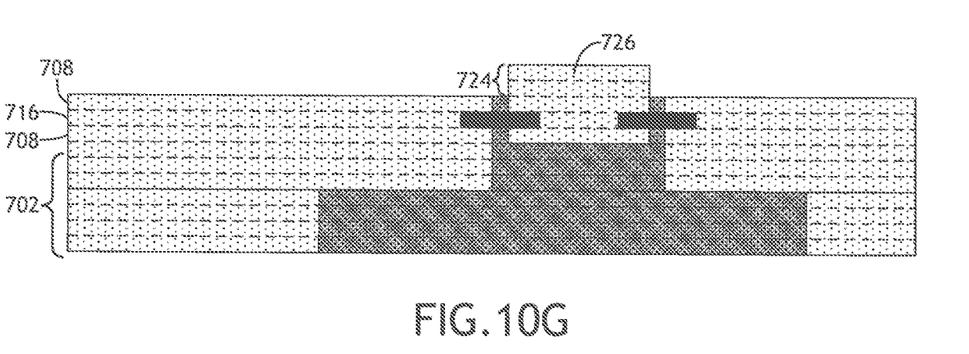
FIG. 10G is a cross-sectional side view of a plurality of printed device layers during a process of manufacturing a harsh environment key panel and bezel structure, in accordance with example embodiments of this disclosure.
Figure 10H:
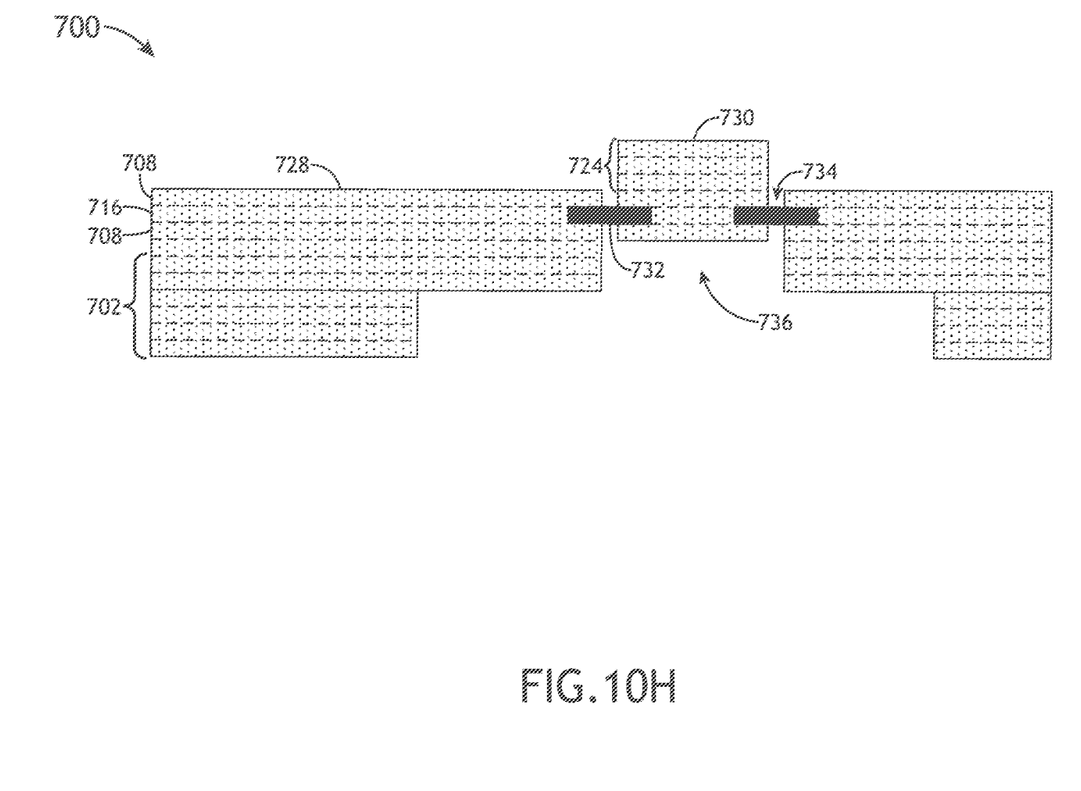
FIG. 10H is a cross-sectional side view of a harsh environment key panel and bezel structure resulting from the manufacturing process illustrated in FIGS. 10A through 10G, after the layers support material have been removed with a solvent, in accordance with example embodiments of this disclosure.

The method 600 includes printing a plurality of device layers with a 3D printer (e.g., 3D printer 500) to form a bezel, a button configured to actuate a switch, and a deformable interface between the bezel and the button (block 602). For example, FIG. 10H shows an example embodiment of the key panel 700 manufactured by the method 600. The key panel 700 includes a bezel 728, a button 730 configured to actuate a switch, and a deformable interface 732 between the bezel 728 and the button 730. The printed device layers of the key panel 700 also define a switch cavity 736 below the button 730 and an airgap 734 between the bezel 728 and the button 730.

The process of printing the plurality of device layers to form the bezel 728, the button 730, and the deformable interface 732 (block 602) can include forming at least one discontinuous printed device layer that includes portions of the bezel 728 and the switch cavity 736 (block 604). For example, FIGS. 10A through 10C illustrate temporarily continuous printed device layers 702 (later referred to as discontinuous printed device layers 702) being formed by dispensing at least one rigid-when-cured device material 704 to form portions of the bezel 728 and a support material 706 to form a temporary structure that provides support for other device layers disposed upon the temporarily continuous printed device layers 702. The support material 706 is removed with a solvent to produce discontinuous device layers 702 that define the switch cavity 736 after printing the other device layers on the temporarily continuous printed device layers 702 and allowing all the printed device layers to cure (e.g., dry and/or harden).

The process of printing the plurality of device layers to form the bezel 728, the button 730, and the deformable interface 732 (block 602) can also include forming at least one discontinuous printed device layer that includes portions of the bezel 728, the button 730, and an airgap 734 between the bezel 728 and the button 730 (block 606). For example, FIG. 10D illustrates another temporarily continuous printed device layer 708 (later referred to as a discontinuous printed device layer 708) being formed by dispensing rigid-when-cured device material (e.g., device material 710 and 714) to form the portions of the bezel 728 and the button 730 and dispensing support material 712 to form a temporary structure that provides support for other device layers disposed upon the temporarily continuous printed device layers 708. The support material 712 is removed with a solvent to produce a discontinuous device layers 708 that defines the airgap 734 between the bezel 728 and the button 730 after printing the other device layers on the temporarily continuous printed device layers 708 and allowing all the printed device layers to cure (e.g., dry and/or harden).

The process of printing the plurality of device layers to form the bezel 728, the button 730, and the deformable interface 732 (block 602) can also include forming a continuous printed device layer that includes portions of the bezel 728, the button 730, and the deformable interface 732 between the bezel 728 and the button 730 (block 608). For example, FIG. 10E illustrates a continuous printed device layer 716 being formed by dispensing rigid-when-cured device material (e.g., device material 718 and 720) to form portions of the bezel 728 and the button 730 and dispensing a deformable-when-cured device material 722 to form a portion of the deformable interface 732 between the bezel 728 and the button 730.

Any of the operations (e.g., blocks 604 through 608) described herein may be repeated any number of times during the process of printing the plurality of device layers to form the bezel 728, the button 730, and the deformable interface 732 (block 602). For example, FIG. 10F illustrates another temporarily continuous printed device layer 708 (to produce another discontinuous printed device layer 708) being formed on top of one or more continuous printed device layers 716. In other embodiments, the continuous printed device layer 716 is flush with the top surface of the bezel 728. The button 730 can be formed to protrude from the bezel 728. For example, FIG. 10G illustrates one or more printed device layer 724 formed by dispensing rigid-when-cured device material 726 to form portions of the button 730 above an uppermost printed device layer (e.g., layer 708) of the bezel 728.

After the printed device layers 702, 708, 716, and 724 are cured (e.g., dried and/or hardened), the key panel 700 may be exposed to (e.g., submerged within) a solvent (e.g., water, alcohol, acetone, limonene, or the like) to remove the support material (e.g., device material 706 and 712). Removing the support material produces discontinuous printed device layers 702 and 708 that form portions of the bezel 728 and the button 730 and also define the switch cavity 736 and the airgap 734 between the bezel 728 and the button 730. An example embodiment of the resulting key panel 700 is illustrated in FIG. 10H. The key panel 700 is continuous in the sense that the printed device layers 702, 708, 716, and 724 are not separated by any adhesive material, gasket material, or the like. Instead, the printed device layers 702, 708, 716, and 724 are fused together to form a continuous 3D structure with the deformable interface 732 being integrated and at least partially embedded within the structures of the bezel 728 and the button 730 so that moisture and debris cannot enter the switch cavity 736 even if the button 730 is pressed while the key panel 700 is submerged in water or otherwise exposed to moisture or debris.

The method 600 is described with respect to the key panel 700 illustrated in FIG. 10H; however, the method 600 can be adapted to produce any of the key panel 200 illustrated in FIGS. 3 through 5 and/or the bezel structures 300 and 400 illustrated in FIGS. 6 and 7, respectively. For example, in some implementations, printed device layers 702, 708, 716, and 724 can include a mixture of two or more rigid-when-cured device materials (e.g., opaque device material and transparent/translucent device material). The deformable-when-cured device material (or materials) can also include opaque, transparent, and/or translucent device materials.

Any 3D printing materials that meet structural specifications for a key panel and/or bezel structure can be used to form the user interface device components (e.g., structures 200, 300, 400, and/or 700) described herein. Some examples of rigid and rigid-when-cured device materials include, but are not limited to: Polylactic Acid (PLA) printing filament; Acrylonitrile Butadiene Styrene (ABS) printing filament; PRO Series PLA printing filament; PRO Series ABS printing filament; Polyamide (aka Nylon) printing filament; Polyamide With Chopped Carbon Fiber Strands (aka NylonX) printing filament; PRO Series Nylon printing filament; Polyethylene terephthalate (PET) printing filament; PETG printing filament; PETT printing filament; PRO Series PET, PETG, or PETT printing filament; Acrylonitrile Styrene Acrylate (ASA) printing filament; PolyPropylene (PP) printing filament; and combinations thereof. Some examples of deformable and deformable-when-cured device materials include, but are not limited to: Thermoplastic Elastomer (TPE) printing filament; PRO Series Flex printing filament; Plasticized Copolyamide TPE (PCTPE) printing filament; Soft PLA (aka flexible PLA) printing filament; Thermoplastic Polyurethane (TPU) printing filament; and combinations thereof. Some examples of support materials (e.g., for printing temporary structures) include, but are not limited to: Polyvinyl Alcohol (PVA) printing filament; High Impact Polystyrene (HIPS) printing filament; LAYaPVA printing filament; LAY-CLOUD printing filament; HIGH-T-LAY printing filament; ETHY-LAY printing filament; and combinations thereof. Any combination of the foregoing device materials may be included in example embodiments of the user interface device components (e.g., structures 200, 300, 400, and/or 700) described herein; however, the foregoing lists of device materials are not exhaustive, and it is contemplated that other device materials with similar structural properties can be used in combination with or in place of the listed device materials.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A user interface device, comprising:
   a touchscreen display;
   a bezel surrounding at least a portion of the touchscreen display;
   a gasket interfacing between the touchscreen display and the bezel;
   a plurality of printed device layers that form a hand stabilizer disposed upon the bezel, the plurality of printed device layers including a continuous printed device layer that includes a first rigid device material that forms an outer portion of the hand stabilizer and a second rigid device material that forms a portion of a light guide embedded within the hand stabilizer, wherein the second rigid device material is transparent or translucent; and a printed board with a light source mounted to the printed board, the light source configured to direct illumination through the light guide embedded within the hand stabilizer; wherein the plurality of printed device layers further includes a discontinuous printed device layer that forms portions of the bezel and a cavity, the cavity configured to receive the light source; wherein the discontinuous printed device layer is formed from at least one rigid-when-cured device material.

2. The user interface device of claim 1, wherein the plurality of printed device layers also forms at least a portion of the bezel.

3. The user interface device of claim 1, wherein the bezel includes a recess configured to receive at least a portion of the hand stabilizer, wherein the hand stabilizer is at least partially embedded within the bezel.

4. The user interface device of claim 1, wherein the first rigid device material is opaque.

5. The user interface device of claim 1, wherein the gasket is formed at least in part by the plurality of printed device layers.

6. The user interface device of claim 1, wherein the gasket is formed at least in part by a deformable-when-cured device material.

7. The user interface device of claim 1, wherein the printed board comprises at least one of a printed wiring board or a printed circuit board.

8. The user interface device of claim 1, wherein the discontinuous printed device layer is supported by a support material during deposition of additional printed device layers on the discontinuous printed device layer.

9. The user interface device of claim 1, wherein the cavity is formed following the support material being removed by a solvent.

* * * * *